United States Patent
Wedeen

(10) Patent No.: US 8,355,772 B2
(45) Date of Patent: Jan. 15, 2013

(54) CROSS-FIBER DIFFUSION MRI

(75) Inventor: Van J. Wedeen, Sommerville, MA (US)

(73) Assignee: The General Hospital Corporation, Boston, MA (US)

( * ) Notice: Subject to any disclaimer, the term of this patent is extended or adjusted under 35 U.S.C. 154(b) by 1128 days.

(21) Appl. No.: 11/817,613

(22) PCT Filed: Mar. 10, 2006

(86) PCT No.: PCT/US2006/008661
§ 371 (c)(1), (2), (4) Date: Oct. 14, 2008

(87) PCT Pub. No.: WO2006/099177
PCT Pub. Date: Sep. 21, 2006

(65) Prior Publication Data
US 2009/0037108 A1    Feb. 5, 2009

Related U.S. Application Data

(60) Provisional application No. 60/660,566, filed on Mar. 11, 2005, provisional application No. 60/660,565, filed on Mar. 11, 2005.

(51) Int. Cl.
*A61B 5/05* (2006.01)
(52) U.S. Cl. ........................................ 600/410; 324/309
(58) Field of Classification Search .................. 324/309; 600/310, 410
See application file for complete search history.

(56) References Cited

U.S. PATENT DOCUMENTS

| | | | |
|---|---|---|---|
| 6,526,305 B1 * | 2/2003 | Mori | 600/410 |
| 6,614,226 B2 | 9/2003 | Weeden | |
| 7,034,531 B1 * | 4/2006 | Tuch et al. | 324/309 |
| 2002/0042569 A1 | 4/2002 | Weeden | |

OTHER PUBLICATIONS

Peter J Basser, Relationships Between Diffusion Tensor and q-Space MRI, MRM 47:392-297 (2002).

* cited by examiner

*Primary Examiner* — Long V. Le
*Assistant Examiner* — Ellsworth Weatherby
(74) *Attorney, Agent, or Firm* — Quarles & Brady, LLP

(57) ABSTRACT

A method for processing MRI data in which a reference direction and a first voxel are selected. A first transverse orientation vector associated with the first voxel is determined. This first transverse orientation vector is normal to the reference direction. On the basis of the first transverse orientation vector, a second voxel is selected. A second transverse orientation vector associated with the second voxel is also selected. This second transverse orientation vector is likewise normal to the reference direction. The method also includes determining whether a relationship between the first and second transverse orientation vectors is consistent with a track normal to the reference direction and extending between the first and second voxels.

18 Claims, 7 Drawing Sheets
(6 of 7 Drawing Sheet(s) Filed in Color)

CROSS-FIBER DIFFUSION MRI

RELATED APPLICATION

This application is the U.S. national stage, under 35 USC 371, of International Application Number PCT/US2006/008661, filed Mar. 10, 2006, which claims the benefit of the priority date of U.S. Provisional Application Nos. 60/660,566, and 60/660,565, both filed Mar. 11, 2005. The contents of these applications are incorporated herein by reference.

STATEMENT OF FEDERALLY SPONSORED RESEARCH

The invention was made with Government support under Grant R01 MH64044 awarded by the National Institute of Health. The Federal Government may have certain rights in the invention.

FIELD OF INVENTION

The invention relates to tractography, and in particular, to the identification and display of tracks from diffusion data.

BACKGROUND

The cortex is an outer layer of the brain that is bounded by an outer boundary and an inner boundary. The outer boundary is the convoluted grey surface familiar from many depictions of the brain. The inner boundary is a surface toward which many white matter tracks are directed. These tracks tend to end at the inner boundary.

The direction that extends across the cortex, from the inner boundary to the outer boundary will be referred to as the radial direction of the cortex. Since the cortex is not spherical, the notion of a radial direction is one that is locally defined. The direction of the plane perpendicular to the radial direction, which is also locally defined, will be referred to as the transverse direction of the cortex.

In an effort to understand the structure of the cortex, it is useful to measure its diffusivity. Known methods of measuring diffusivity include those in which one obtains MRI images of the brain.

Diffusivity is a vector quantity having an associated direction. Within the cortex, the diffusivity is dominated by its radial component. However, within the cortex, there appears to be little observable structure in the radial component of diffusivity. What structure there is appears to be more readily elucidated by examining the transverse component, not the radial component. Unfortunately, the transverse components of diffusivity are precisely the components that are the most difficult to discern.

SUMMARY

The invention is based on the recognition that one can isolate diffusivity in a particular direction by weighting a probability density function associated with each voxel with a particular geometric weighting factor that represents a surface along which diffusivity is more readily discernable.

In one aspect, the invention includes a method for processing MRI data in which a reference direction and a first voxel are selected. A first transverse orientation-vector associated with the first voxel is determined. This first transverse orientation-vector is normal to the reference direction. On the basis of the first transverse orientation-vector, a second voxel is selected. A second transverse orientation-vector associated with the second voxel is also selected. This second transverse orientation-vector is likewise normal to the reference direction. The method also includes determining whether a relationship between the first and second transverse orientation-vectors is consistent with a track normal to the reference direction and extending between the first and second voxels.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and the accompanying figures, in which:

BRIEF DESCRIPTION OF THE FIGURES

The patent or application file contains at least one drawing executed in color. Copies of this patent or patent application publication with color drawing(s) will be provided by the Office upon request and payment of the necessary fee.

DETAILED DESCRIPTION

Figure 1:
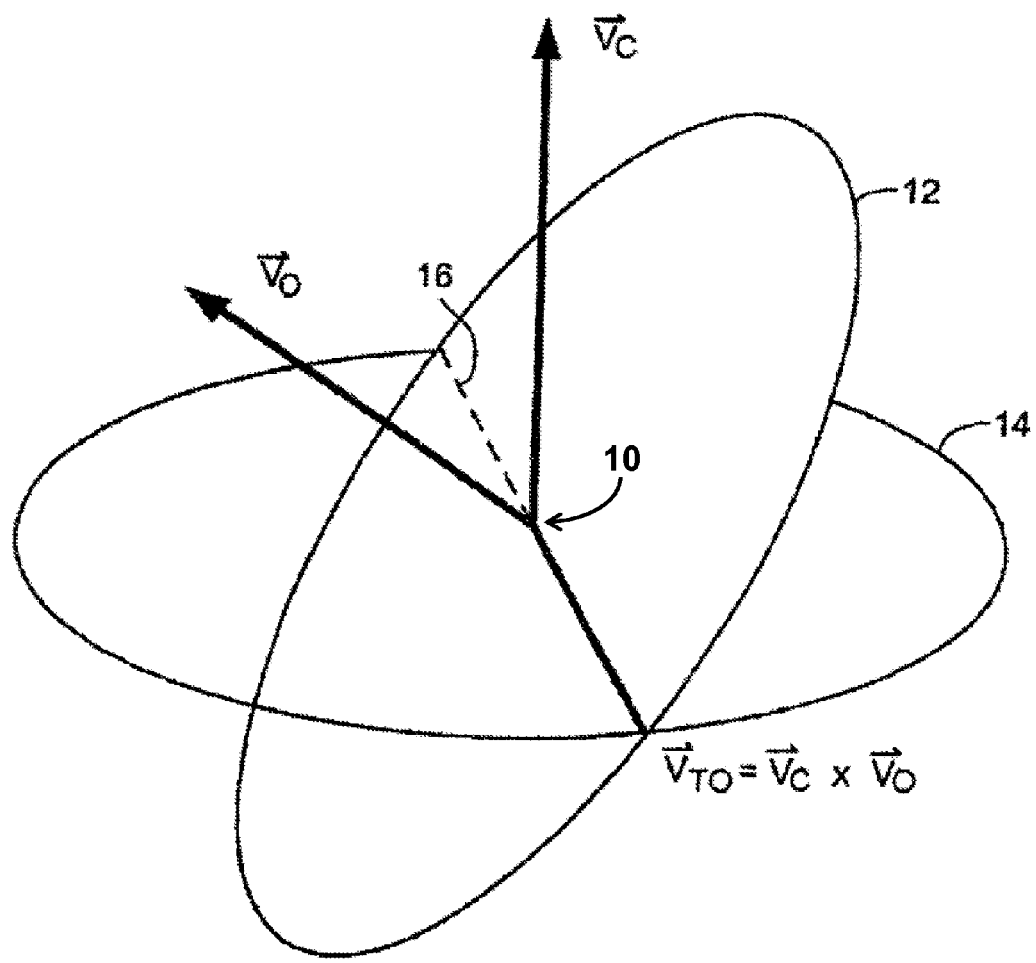
FIG. 1 shows the geometry associated with obtaining the transverse orientation vector.

Each voxel in an image has an associated orientation density function having associated orientation vectors. The direction of each orientation vector indicates a direction in which there exists a local maximum in diffusivity. This, in turn, suggests a direction of a track that passes through the voxel.

The present disclosure provides a method for constraining the orientation vectors to be normal to a reference direction. By selecting reference directions to define a two-dimensional space that extends in the transverse direction through the cortex, one can isolate the diffusivity in the transverse direction within the cortex.

Each voxel also has a family of planes that pass through that voxel. Each of these planes is defined by a normal vector, which is a function of two angles. Thus, each voxel has associated with it a bouquet of normal vectors, all pointing in different directions, with each such normal vector identifying one of the planes passing through the voxel.

Each of these planes also has an associated diffusivity, which is obtained by integrating the diffusivity associated with each vector that originates at the voxel's center and extends outward within that plane. Thus, there exists a function of two angles whose value at a particular angle pair represents the diffusivity associated with that particular plane whose normal vector points in the direction specified by that angle pair. This function is analogous to an orientation density function. For this reason, this function will be referred to as a "generalized orientation-density function."

Like the orientation density function, the generalized orientation-density function can have several local maxima. These local maxima correspond to planes of maximum diffusivity. The angle pair associated with a particular local maximum identifies the orientation of the plane corresponding to that local maximum. It does so by specifying the direction of a vector normal to that plane. These normal vectors will be referred to as "orientation vectors." The plane associated with a particular orientation vector will be referred to as an "orientation plane." Each voxel thus has associated with it a bouquet of these orientation vectors.

The next step in evaluating a diffusivity that is constrained to be normal to a reference direction is to define that reference direction. To identify transverse diffusivity within the cortex, it is useful to constrain the tracks to extend in the cortical ribbon direction. Thus, a suitable reference direction is one that is normal to the cortical ribbon direction. A vector, which will be referred to as the "cortical vector," that extends in this reference direction defines a plane, which will be referred to as the "cortical plane."

There are, of course, many cortical planes. There is an outermost one that corresponds to the outer boundary of the cortex, an innermost one that corresponds to the inner boundary of the cortex, and all the planes between the two. The particular cortical plane used in the method described herein will depend on how deep within the cortex one seeks to evaluate the transverse diffusivity.

At each voxel on a selected cortical plane, the cross product of the cortical vector and any orientation vector associated with that voxel will lie in that cortical plane. The vector that results from this cross product will be referred to as the "transverse orientation vector" to distinguish it from the orientation vectors from which it came. Thus, just as each voxel bears a bouquet of orientation planes associated with it, each voxel also bears a bouquet of transverse orientation vectors, each of which corresponds to one of those planes. These transverse orientation vectors can be used to build tracks confined to the transverse plane in exactly the same way that the orientation vectors are used to build tracks.

FIG. 1 illustrates the geometry associated with a particular voxel 10 and a particular orientation plane 12 from the set of orientation planes associated with that voxel. A vector normal to the orientation plane 12 is the orientation vector $v_O$. The orientation plane 12 intersects a cortical plane 14 along an intersection line 16. The cortical plane 14 is defined by its normal vector, which is the cortical vector $v_C$. The cross product of the cortical vector $v_C$ and the orientation vector $v_O$ results in a transverse orientation vector $V_{TO}$ along the intersection line 16.

One way to identify the cortical vector $v_C$ is to recognize that the dominant direction of diffusivity within the cortex is in the radial direction. Thus, the direction of dominant cortical diffusivity defines the normal vector to the cortical plane, which is the cortical vector $v_C$.

One way to identify the orientation vectors $v_O$ is to recognize that in DS-MRI ("Diffusion Spectrum Magnetic Resonance Imaging"), one can readily obtain the Fourier transform of a probability density function associated with each voxel. Any local maxima in the Fourier transform domain would therefore correspond to planes that: (1) pass through that voxel in the spatial domain, and (2) have local maxima in diffusivity. The orientation of these planes can then be obtained by evaluating an inverse Fourier transform.

Figure 2:
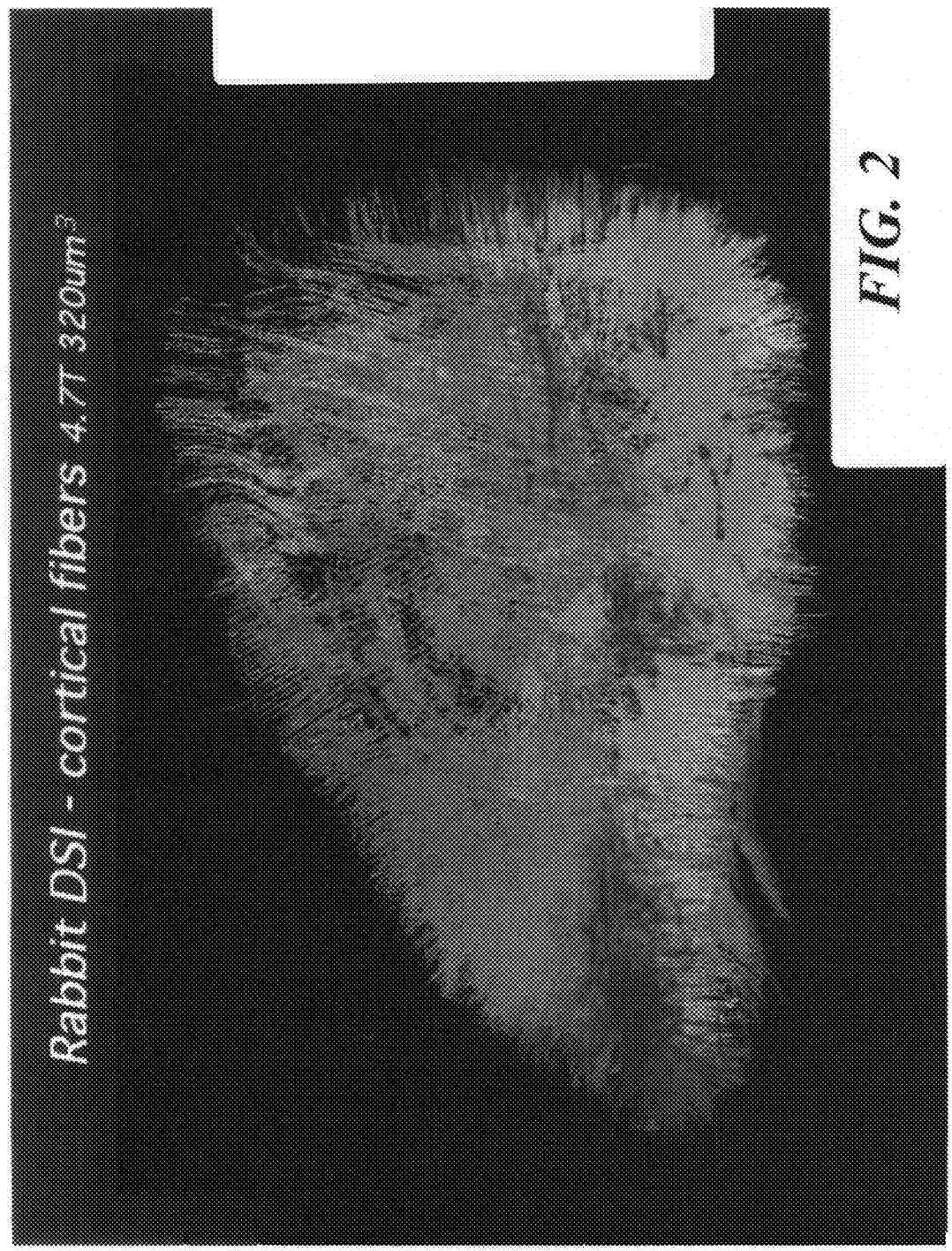
FIG. 2 shows transverse tracks in a rabbit cortex as obtained by the method described herein.
Figure 3:
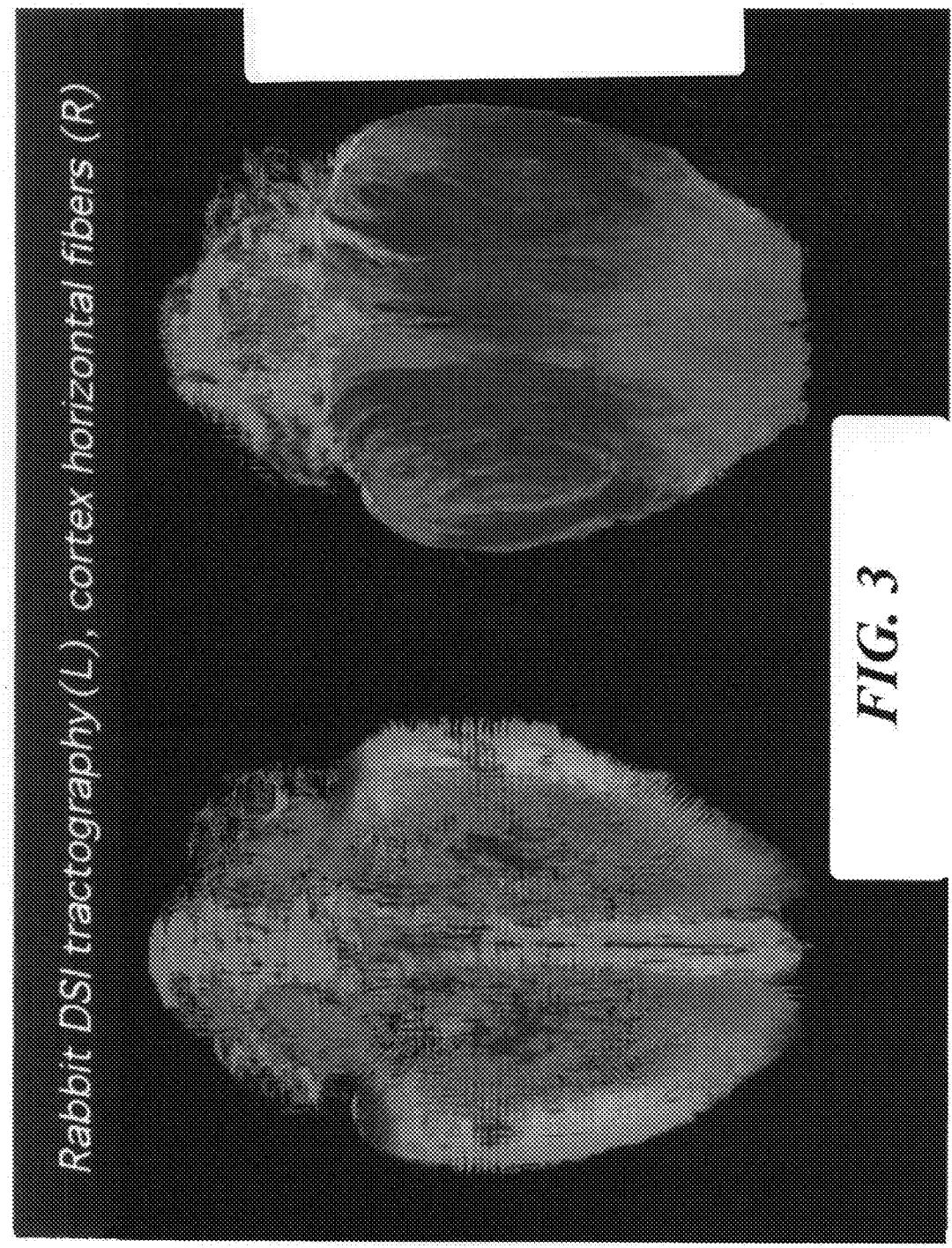
FIG. 3 shows another view of transverse tracks in a rabbit cortex.
Figure 4:
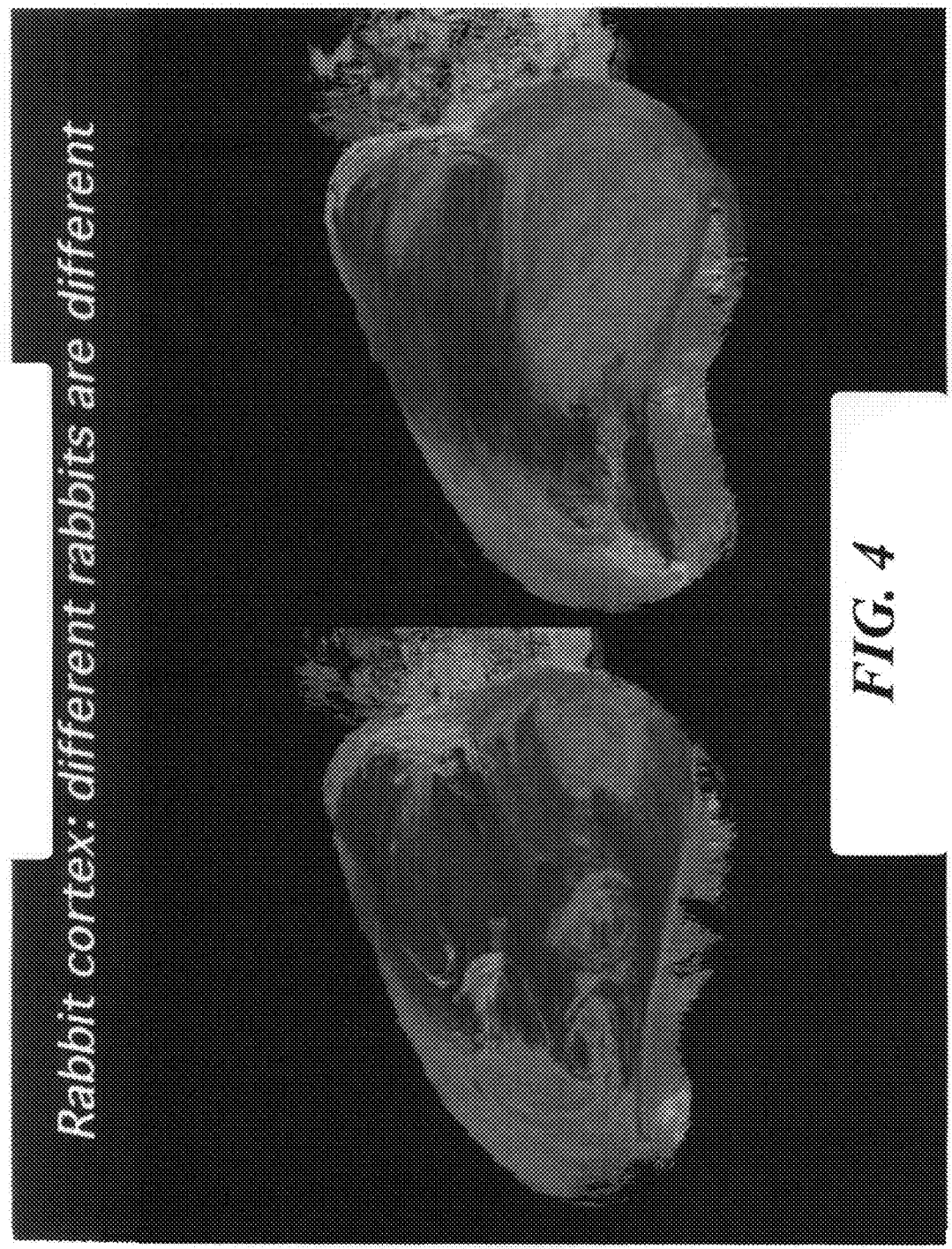
FIG. 4 compares transverse tracks from the cortices of two different rabbits.

FIGS. 2-6 show the results of applying the method described herein to view transverse tracks. In particular, FIGS. 2-3 show transverse tracks in a rabbit cortex.

The method renders cortical structure clearly enough to enable one to distinguish between the cortices of different individuals of the same species. For example, in FIG. 4 one can clearly see differences in the transverse tracks from the cortices of two different rabbits.

Figure 5:
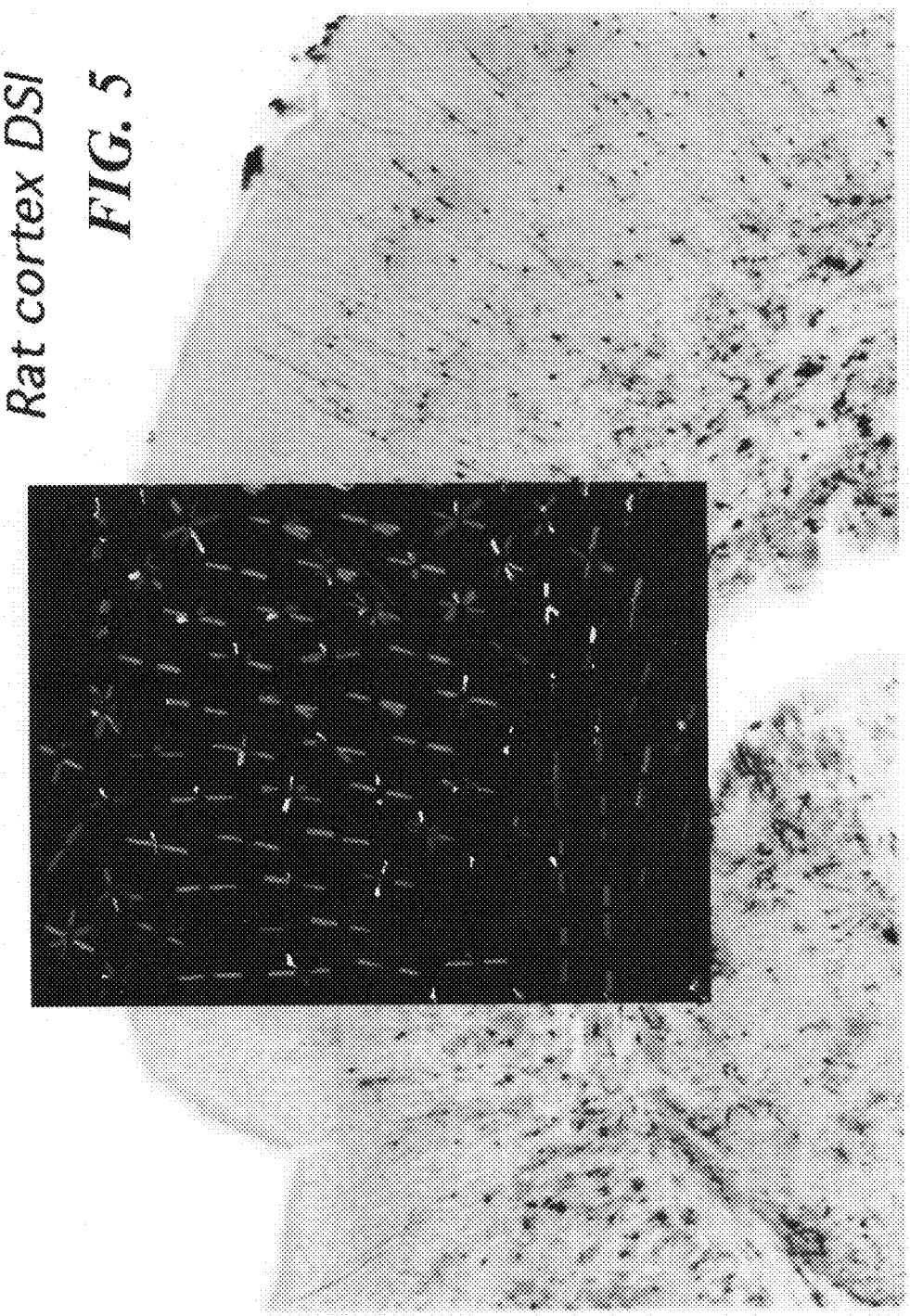
FIG. 5 shows the disorderly character of maxima of radial diffusivity in a rat cortex.
Figure 6:
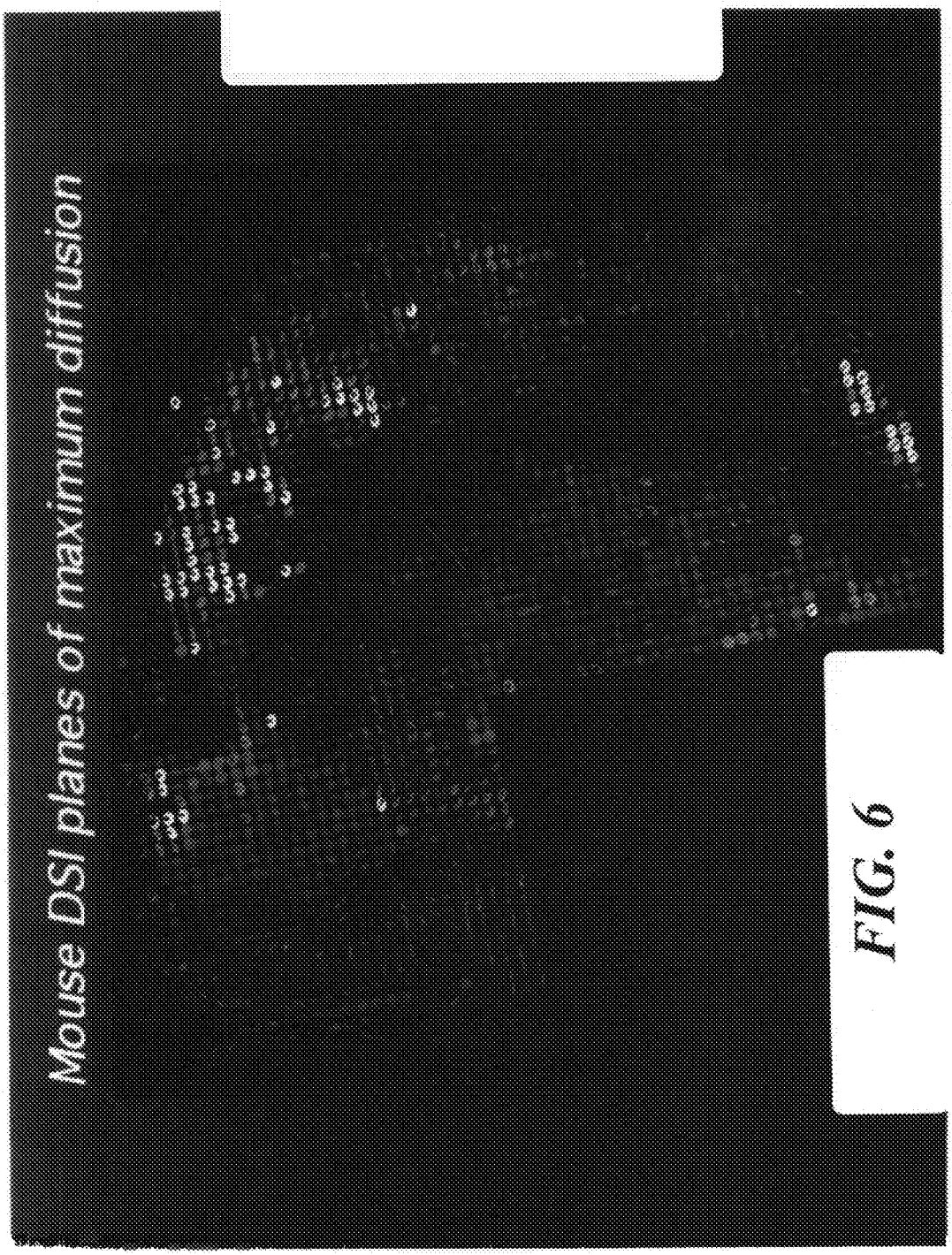
FIG. 6 shows the more orderly character of maxima of transverse diffusivity in a mouse cortex.

FIGS. 5 and 6 highlight the advantage of being able to view the transverse components of cortical tracks. In FIG. 5, the disorderly character of maxima of radial diffusivity in a rat cortex is readily apparent. In contrast, in FIG. 6, one can immediately see the more orderly character of maxima of transverse diffusivity in a mouse cortex.

Figure 7:
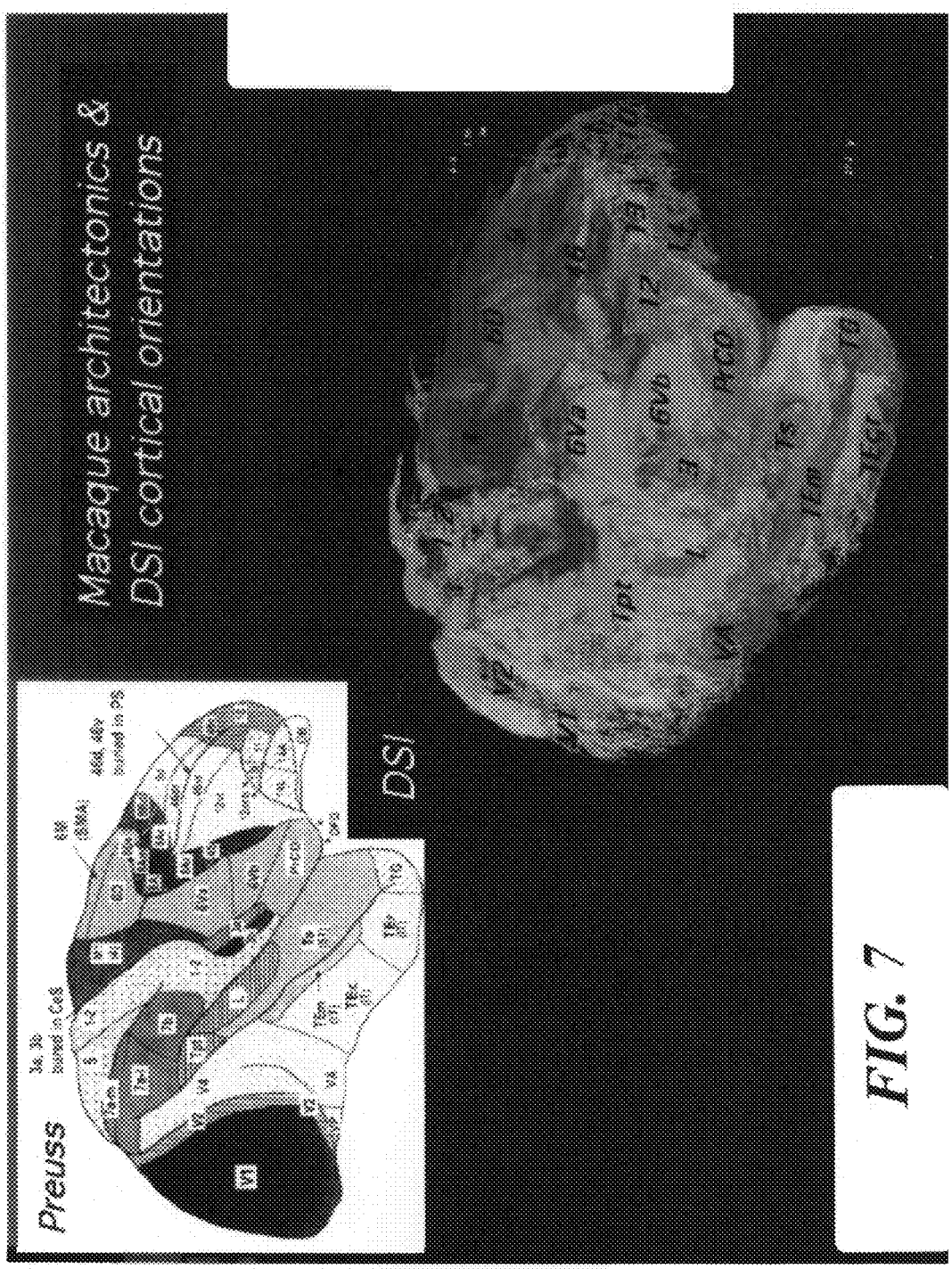
FIG. 7 shows correlation of the orientation of transverse cortical tracks with the architectonics of a macaque cortex.

The transverse tracks are rendered with sufficient clarity so that one can see the correlation between the structure of the tracks and the underlying anatomical structures. For example, FIG. 7 shows the correlation between the orientation of transverse cortical tracks and the architectonics of a macaque cortex.

A generalization of the foregoing concept lies in recognizing that the family of geometric shapes whose associated diffusivity is sought need not be a family of planes. For example, one can define a family of cones associated with each voxel and consider the diffusivity within each of those cones. The angle pair would then identify the orientation of a cone instead of a plane. In this case, the generalized orientation-density function identifies diffusivity at each of a multiplicity of cones. In arriving at this generalization, it is instructive to note that a plane is nothing more than a cone having a ninety-degree cone angle, and that as the cone angle approaches zero, the generalized orientation-density function converges to an orientation density function along a line.

The family of shapes associated with the generalized orientation-density function need not be conical. Any family of shapes can be used. In fact, the shapes need not be a two-dimensional surfaces, such as planes and cones. Instead, the family of shapes can be a family of three-dimensional volumes.

One can also provide a weighting function that depends on the direction of diffusivity within a volume or surface. For example, if the three dimensional volume is a solid cone, one might, in determining the total diffusivity associated with that solid cone, weight diffusivity along the cone axis more heavily than diffusivity along the cone's periphery.

A further generalization of the foregoing concept lies in recognizing that in each of the examples discussed thus far, there exists a locus of points that defines an intersection between a shape from the family of shapes and a circumscribing sphere surrounding the voxel. Where the shape is a plane, the locus of points forms a great circle on the circumscribing sphere. Where the shape is a cone, the locus of points defines a circle. Where the shape is a solid, the locus of points is a two-dimensional area, instead of a one-dimensional curve, on the sphere.

In all these cases, evaluating the diffusivity associated with one shape from the family of shapes can be viewed as evaluating the flux of diffusivity through the intersection of that shape with the circumscribing sphere. In the case of a two-dimensional shape, this would amount to evaluating a line integral. For example, where the shape is a plane, this amounts to evaluating a line integral along 180 degrees of a great circle. Where the shape is a solid, this amounts to evaluating a surface integral along the patch that corresponds to the intersection of that shape with the circumscribing sphere. In each of these examples, a weighting function, if any, can be included in the integrand, with the result that the integration can be viewed as a convolution between the weighting function and the flux across the intersection.

Viewed in this way, one can simply dispense with the underlying family of shapes altogether, define arbitrary regions on the circumscribing sphere, and integrate the diffusivity flux through those regions, with or without a weighting function. The regions could then take on any arbitrary shape, and in fact would not need to be continuous.

The method described herein can also be viewed as a way to generate a bouquet of vectors at each voxel by using a first orientation density function that depends on diffusivity, and a second orientation density function that depends on some other parameter, for example on a geometric constraint.

A particular example of a second orientation density function is a geometric orientation density function. Such an orientation density function can represent a surface in which the tracks are constrained to lie. Exemplary surfaces include a plane parallel to a cortical surface.

A particular example of a first orientation density function is one that represents the orientation disks. Other examples are those that represent orientation cones.

Having described the invention, and a preferred embodiment thereof, what I claim as new and secured by Letters Patent is:

1. A non-transitory computer-readable medium having encoded thereon software for processing MRI data, the software comprising instructions for:
   selecting a reference direction;
   selecting a first voxel;
   determining a first transverse orientation vector associated with the first voxel, the first transverse orientation vector being normal to the reference direction;
   selecting a second voxel at a desired position relative to the first transverse orientation vector;
   selecting a second transverse orientation vector associated with the second voxel, the second transverse orientation vector being normal to the reference direction; and
   determining whether a relationship between the first and second transverse orientation vectors is consistent with a track normal to the reference direction and extending between the first and second voxels.

2. The non-transitory computer-readable medium of claim 1, wherein the instructions for selecting a reference direction comprise instructions for selecting a direction normal to a cortical plane.

3. The non-transitory computer-readable medium of claim 1, wherein the instructions for determining a first transverse orientation vector comprise instructions for:
   determining an orientation surface associated with a local maximum of diffusivity at the first voxel; and determining a first vector that is normal to the orientation surface;
   determining a second vector that is parallel to the reference direction; and
   determining the first transverse orientation vector on the basis of with respect to the first and second vectors.

4. The non-transitory computer-readable medium of claim 1, wherein the instructions for determining whether a relationship between the first and second transverse orientation vectors is consistent with a track normal to the reference direction and extending between the first and second voxels comprise instructions for:
   specifying a difference threshold;
   determining a difference between a direction of the first transverse orientation vector and the second transverse orientation vector; and
   determining that a track normal to the reference direction extends between the first and second voxels when the difference is less than the difference threshold.

5. The non-transitory computer-readable medium of claim 1, wherein the instructions for selecting a second transverse orientation vector associated with the second voxel comprise:
   identifying a plurality of candidate transverse orientation vectors associated with the second voxel; and
   selecting, from the plurality of candidate transverse orientation vectors, that transverse orientation vector that is closes to being parallel to the first transverse orientation vector.

6. The non-transitory computer-readable medium of claim 1, wherein the instructions for selecting the second voxel comprise instructions for selecting a voxel that is pointed to by the first transverse orientation vector.

7. A magnetic resonance imaging system comprising
   a magnetic field source;
   a detection subsystem for detecting electromagnetic radiation generated in response to operating the magnetic field source;
   a controller for controlling operation of the magnetic field source and the detection subsystem;
   a processing subsystem for generating diffusion data using data provided by the detection subsystem, the processing subsystem being configured to:
   select a reference direction;
   select a first voxel;
   determine a first transverse orientation vector associated with the first voxel, the first transverse orientation vector being normal to the reference direction;
   select a second voxel at a desired position relative to the first transverse orientation vector;
   select a second transverse orientation vector associated with the second voxel, the second transverse orientation vector being normal to the reference direction; and determine whether a relationship between the first and second transverse orientation vectors is consistent with a track normal to the reference direction and extending between the first and second voxels.

8. The system of claim 7, wherein the processing subsystem is configured to select a reference direction at least in part by selecting a direction normal to a cortical plane.

9. The system of claim 7, wherein the processing subsystem is configured to determine a first transverse orientation vector at least in part by:
   determining an orientation surface associated with a local maximum of diffusivity at the first voxel; and
   determining a first vector that is normal to the orientation surface;
   determining a second vector that is parallel to the reference direction; and
   determining the first transverse orientation vector with respect to the first and second vectors.

10. The system of claim 7, wherein the processing subsystem is configured to determine whether a relationship between the first and second transverse orientation vectors is consistent with a track normal to the reference direction and extending between the first and second voxels at least in part by:
   specifying a difference threshold;
   determining a difference between a direction of the first transverse orientation vector and the second transverse orientation vector; and determining that a track normal to the reference direction extends between the first and second voxels when the difference is less than the difference threshold.

11. The system of claim 7, wherein the processing subsystem is configured to select a second transverse orientation vector associated with the second voxel at least in part by:
identifying a plurality of candidate transverse orientation vectors associated with the second voxel; and
selecting, from the plurality of candidate transverse orientation vectors, that transverse orientation vector that is closes to being parallel to the first transverse orientation vector.

12. The system of claim 7, wherein the processing subsystem is configured to select the second voxel at least in part by selecting a voxel that is pointed to by the first transverse orientation vector.

13. A method for processing MRI data, the method comprising:
providing medical imaging data acquired from a subject of a medical imaging system;
selecting a reference direction;
selecting a first voxel;
determining a first transverse orientation vector associated with the first voxel, the first transverse orientation vector being normal to the reference direction;
selecting a second voxel at a desired position relative to the first transverse orientation vector;
selecting a second transverse orientation vector associated with the second voxel, the second transverse orientation vector being normal to the reference direction;
determining whether a relationship between the first and second transverse orientation vectors is consistent with a track in the medical imaging data that is normal to the reference direction and that extends between the first and second voxels; and
generating a medical image from the medical imaging data indicating the track and the relationship is present.

14. The method of claim 13, wherein selecting a reference direction comprises selecting a direction normal to a cortical plane.

15. The method of claim 13, wherein determining a first transverse orientation vector comprises:
determining an orientation surface associated with a local maximum of diffusivity at the first voxel; and
determining a first vector that is normal to the orientation surface;
determining a second vector that is parallel to the reference direction; and
determining the first transverse orientation vector with respect to the first and second vectors.

16. The method of claim 13, wherein determining whether a relationship between the first and second transverse orientation vectors is consistent with a track normal to the reference direction and extending between the first and second voxels comprises:
specifying a difference threshold; determining a difference between a direction of the first transverse orientation vector and the second transverse orientation vector; and
determining that a track normal to the reference direction extends between the first and second voxels when the difference is less than the difference threshold.

17. The method of claim 13, wherein selecting a second transverse orientation vector associated with the second voxel comprises:
identifying a plurality of candidate transverse orientation vectors associated with the second voxel; and
selecting, from the plurality of candidate transverse orientation vectors, that transverse orientation vector that is closes to being parallel to the first transverse orientation vector.

18. The method of claim 13, wherein selecting the second voxel comprises selecting a voxel that is pointed to by the first transverse orientation vector.

* * * * *

UNITED STATES PATENT AND TRADEMARK OFFICE
CERTIFICATE OF CORRECTION

PATENT NO. : 8,355,772 B2  
APPLICATION NO. : 11/817613  
DATED : January 15, 2013  
INVENTOR(S) : Van J. Wedeen Page 1 of 1

It is certified that error appears in the above-identified patent and that said Letters Patent is hereby corrected as shown below:

Column 5, Claim 3, lines 56-57, "vector on the basis of with" should be --vector with--.

Signed and Sealed this  
Nineteenth Day of March, 2013

Teresa Stanek Rea  
*Acting Director of the United States Patent and Trademark Office*

UNITED STATES PATENT AND TRADEMARK OFFICE
CERTIFICATE OF CORRECTION

PATENT NO. : 8,355,772 B2  Page 1 of 1
APPLICATION NO. : 11/817613
DATED : January 15, 2013
INVENTOR(S) : Van J. Wedeen It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1527 days.

Signed and Sealed this
First Day of September, 2015

Michelle K. Lee
*Director of the United States Patent and Trademark Office*